United States Patent [19]

Lamattina et al.

[11] Patent Number: 4,584,479
[45] Date of Patent: Apr. 22, 1986

[54] ENVELOPE APPARATUS FOR LOCALIZED VACUUM PROCESSING

[75] Inventors: John R. Lamattina, Wakefield; Paul F. Petric, Swampscott, both of Mass.

[73] Assignee: Varian Associates, Inc., Palo Alto, Calif.

[21] Appl. No.: 708,104

[22] Filed: Mar. 5, 1985

Related U.S. Application Data

[63] Continuation of Ser. No. 435,179, Oct. 19, 1982.

[51] Int. Cl.$^4$ .................. H01J 37/18; H01J 33/02
[52] U.S. Cl. .................. 250/441.1; 250/492.2; 219/121 EN; 219/121 EQ
[58] Field of Search .............. 250/441.1, 442.1, 492.1; 219/121 EN, 121 EQ

[56] References Cited

U.S. PATENT DOCUMENTS

| | | | |
|---|---|---|---|
| 3,156,811 | 11/1964 | Barry | 219/121 EQ |
| 3,388,235 | 6/1968 | Pinsley et al. | 219/121 EQ |
| 3,426,173 | 2/1969 | Steigerwald | 219/121 |
| 3,504,371 | 3/1970 | Reeds, Jr. | 346/110 |
| 4,191,385 | 3/1980 | Fox et al. | 277/3 |
| 4,342,900 | 8/1982 | Susei et al. | 219/121 EN |
| 4,358,657 | 11/1982 | Steigerwald et al. | 219/121 EN |
| 4,393,295 | 7/1983 | Beisswenger et al. | 219/121 EJ |

FOREIGN PATENT DOCUMENTS 2023336A 12/1979 United Kingdom.
2027271A 2/1980 United Kingdom.

OTHER PUBLICATIONS

Lewis et al., "A Laser Interferometer Controlled X, Y Air Bearing for Direct Wafer Exposure Electron Beam Lithography," *Proc. 10th Int. Conf. on Electron and Ion Beam Science and Technology*, p. 477 (1982).
Fox, "Planar Vacuum Seal for Isolating an Air Bearing," U.S. Ser. No. 107,207, filed Dec. 26, 1979 (Corresponding PCT Application No. US80/01718), published Jul. 8, 1982.

*Primary Examiner*—Alfred E. Smith
*Assistant Examiner*—Jack I. Berman
*Attorney, Agent, or Firm*—Stanley Z. Cole; William R. McClellan

[57] ABSTRACT

An envelope apparatus is provided for facilitating the production of a vacuum at a localized region on the surface of an article such as a semiconductor wafer. The vacuum permits vacuum processing in the localized region. The envelope apparatus includes an internal processing zone in which the requisite processing level vacuum is maintained. The envelope apparatus also includes intermediate vacuum zones surrounding the internal processing zone. The internal processing zone and surrounding intermediate vacuum zones are exposed at an external surface so that when the external surface is placed in spaced apart, close coupled opposition to the article being processed a graded vacuum seal is formed. The graded seal extends from the internal processing zone, past the intermediate vacuum zones and out to ambient. The envelope apparatus is held either in a fixed position with respect to the surface of the article or actively tracks the topography of the surface of the article so that the gap between the external surface and the surface of the article lies within an acceptable range. For semiconductor processing applications, it has been found that a graded seal formed by two-stage differential pumping and having a gap in the range of 20 micrometers to 40 micrometers will permit vacuums on the order of $10^{-5}$ Torr to be maintained within the interior processing zone of the envelope apparatus.

15 Claims, 10 Drawing Figures

ENVELOPE APPARATUS FOR LOCALIZED VACUUM PROCESSING

GOVERNMENT RIGHTS

The Government has rights in this invention pursuant to Contract No. F19628-80-C-0173 awarded by the Department of the Air Force.

BACKGROUND OF THE INVENTION

This application is a continuation of application Ser. No. 435,179, filed Oct. 19, 1982.

This invention relates to apparatus for carrying out a process in a vacuum and, more particularly, relates to an envelope apparatus for carrying out a process in a vacuum at a localized region on the surface of an article.

The processing of articles in a vacuum has generally occurred within a sealed chamber, given that processing in the evacuated region outside the earth's atmosphere is not feasible except for specialized space experiments. For vacuum processing on terra firma, articles are loaded into a chamber, and the chamber is then sealed and evacuated. The process of choice is then carried out within the chamber; such processes would include sputtering, vacuum deposition, welding or treatment by a charged particle beam. For example, see H. Kita, et al., "Method of Treating a Workpiece with Electron Beams and Apparatus Therefor," U.S. Pat. No. 4,327,273; A. I. Plyshevsky, et al., "Apparatus for Vacuum Coating of a Substrate," U.S. Pat. No. 3,990,390.

In the semiconductor processing industry the batch approach has been widely employed. The batch approach requires that the chamber be opened to the external environment when the wafers comprising the batch are loaded and when they are unloaded. This requires a complete pumpdown of the chamber for each successive batch. The breaking of the vacuum of the chamber allows potential contaminants into the system and permits all exposed surfaces within the chamber to adsorb gases. During the ensuing pumpdown these adsorbed gases must be removed in addition to removing the gas filling the volume of the chamber. In addition, such equipment must possess a high level of complexity particularly if automatic loading and transport are features of the equipment. As examples of conventional batch processing by vacuum, see E. H. Voight, et al., "Apparatus for Processing Semiconductor Devices", U.S. Pat. No. 3,749,838; C. D. Dobson, "Enclosures for Vacuum Coating," U.S. Pat. No. 3,892,198; and D. Maydon, "High Capacity Etching Apparatus," U.S. Pat. No. 4,298,443.

In the evolution of vacuum processing techniques, particularly as practiced in the semiconductor processing industry, the tendency has been to more efficiently utilize vacuum. To accomplish efficient vacuum utilization, processing equipment has been developed which minimizes the time required for loading and unloading, which utilizes loadlock chambers to prevent the main processing chamber from returning to ambient each time an article is unloaded from or loaded into the chamber and which reduces the size of the main chamber to minimize the surface area which will adsorb gases and to reduce pumping requirements. Also, the main chamber and processing equipment within the chamber have been fabricated from non-volatile materials so as to reduce outgassing into the chamber.

Serial processing of individual semiconductor wafers has been carried out for many reasons including reducing the size and most often the complexity of the vacuum chamber. In theory, the chamber may be reduced in size to nearly the size of the wafer, as exemplified in the situation where the processing station may form one wall of the chamber. Serial processing is exemplified by the apparatus of J. D. Helms, "Low Volume Deposition Reactor", U.S. Pat. No. 3,721,210. In Helms '210 a semiconductor wafer is loaded on a support disk and moved successively to low volume reaction chambers. As disclosed in F. T. Turner, et. al., "Individual Wafer Metalizing System-A Case History," Industrial Research & Development, March, 1982, p. 150, April, 1982, p. 148, individual wafers are introduced from a cassette through a loadlock onto a transfer plate. The wafers are held in place by clips on the transfer plate. The transfer plate is rotated so as to present the wafer for treatment at successive processing stations. The volume of the chamber at each successive station is exceptionally small since the wafer is presented in close coupled opposition to each processing apparatus. Also, each chamber is not opened up to ambient, but is only exposed briefly to the adjacent chamber as the wafer is transferred. Thus, the inefficient use of vacuum associated with batch processing of wafers is thereby eliminated. However, throughput is still affected by the need to load the wafer into a loadlock or into the chamber with the associated requirement of pumping out the volume before commencing processing. And since the semiconductor wafer is loaded into a volume in which a high quality vacuum is ultimately generated, an enclosure at least as large as the wafer is required. Also, the mechanical complexity of the system for wafer transport is still high due to the need for vacuum air interfaces. Since the whole wafer is maintained within the vacuum only radiative thermal transfer is readily available to heat or cool the wafer. Excessive temperature levels may therefore result during such processes as ion implantation or sputter etching. Or, the wafer may not be satisfactorily heated within a vacuum chamber when the process requires heating the wafer.

For focused charged particle beam processing the vacuum region in prior art equipment is usually significantly greater than the localized region at which processing occurs. This localized region may be a spot-sized region or a well-defined scanned field much smaller than the total surface area of the wafer. Typically, the semiconductor wafer is moved relative to the beam while the beam is making small movements in order to obtain full processing of the surface of the wafers. The wafer translation apparatus is also typically included within the vacuum volume thereby increasing the required size and complexity of the vacuum chamber and associated mechanical systems.

It is therefore an object of the present invention to provide an envelope apparatus which permits localized vacuum processing on the surface of an article.

It is a further object of the present invention to provide an envelope apparatus which forms a graded vacuum seal on the surface of an article being treated between an internal vacuum processing zone and the external ambient.

It is another object of the present invention to provide an envelope apparatus which provides a vacuum only at the localized region on the surface of an article where vacuum is required to support the process being employed.

It is another object of the present invention to provide an envelope apparatus which provides a vacuum at the localized region on the surface of an article without physically contacting the article.

BRIEF DESCRIPTION OF THE DRAWINGS

For a more complete understanding of the vacuum envelope apparatus of the present invention, reference may be had to the accompanying figures which are incorporated herein by reference and in which.

SUMMARY OF THE INVENTION

An envelope apparatus is provided for facilitating the production of a vacuum in a localized region on the surface of an article such as a semiconductor wafer. The presence of the vacuum permits specialized processing to be carried out. The envelope structure defines an internal processing zone in which the processing level vacuum is maintained. Intermediate vacuum zones surrounding the internal processing zone are also defined. The internal processing zone and surrounding vacuum zones are exposed at a surface of the envelope apparatus so that when the surface is placed in close coupled opposition to the article being processed, a graded vacuum seal is formed extending from the internal processing zone outwardly. The vacuum envelope is held either in a fixed position or actively tracks the topography of the surface of the article so that the gap between the end of the tip and the surface of the article lies within an acceptable range. This forms a noncontacting graded vacuum seal to an ambient environment outside the vacuum envelope. For semiconductor processing applications, it has been found that a graded seal formed by two-stage differential pumping and having a gap in the range of 20 micrometers to 40 micrometers will permit vacuums on the order of $10^{-5}$ Torr or lower to be maintained within the interior processing zone of the envelope apparatus.

DESCRIPTION OF THE PREFERRED EMBODIMENTS

Figure 1:
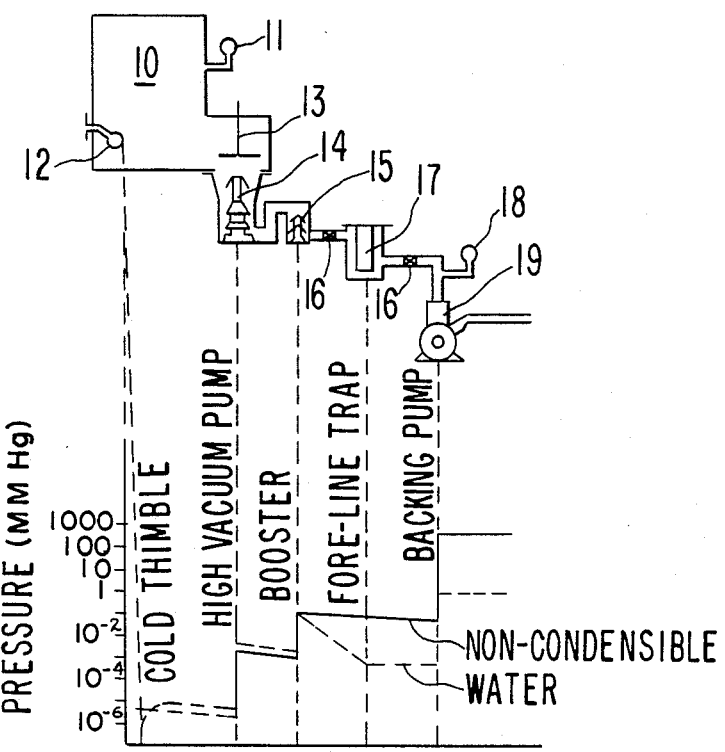
FIG. 1 is a side schematic view of a batch type vacuum processing system.

State of the art vacuum processing is accomplished in sealed vacuum chambers. As shown in FIG. 1 a vacuum chamber 10 is evacuated and maintained at high vacuum by high vacuum pump 14 such as a diffusion, ion or cryogenic pump. The high vacuum pump 14 is backed up by roughing pump 19 via cold trap 17 and valves 16. A booster pump 15 or other auxilliary pump, e.g., a Roots blower pump, may be employed for a further intermediate pumping stage. High vacuum valve 13 seals the vacuum pumps from chamber 10 during loading and unloading of the chamber. High vacuum manometer 11 monitors the vacuum in chamber 10 while manometer 18 indicates the roughing vacuum in the foreline. In operation, the article being processed in a vacuum is placed in its entirety into chamber 10. For each batch of articles the system must be fully pumped down to a sufficiently high vacuum level to support the process and the vacuum must be maintained while the process is underway even if outgassing of the chamber walls occurs due to the elevated temperature experienced during the processing. In addition, objects larger than the size of available vacuum chambers may not be subjected to batch vacuum processing.

Localized vacuum processing produces efficient utilization of vacuum and reduces the size and complexity of vacuum processing apparatus. For certain applications it may be permissible to contact the article being processed in order to form the seal. For example, in S. Susei, et al., "Vacuum Shield Device of an Electron Beam Welding Apparatus," U.S. Pat. No. 4,342,900, a shield member fabricated from heat-resistant, flexible material is pressed against the article. The open interior of the shield member forms a processing zone where vacuum is maintained to support an electron beam welding process. For certain other applications the processing apparatus may not be allowed to make contact with the wafer. For example, in the processing of semiconductor wafers the upper surface of the wafer must not be contacted so as to avoid damage to regions already processed, to avoid breaking the wafer and to prevent the generation of microparticulates which could interfere with subsequent processing or contaminate the wafer. Thus, when processing semiconductor wafers it is desirable to accomplish localized vacuum processing without physically contacting the wafer.

Figure 2:
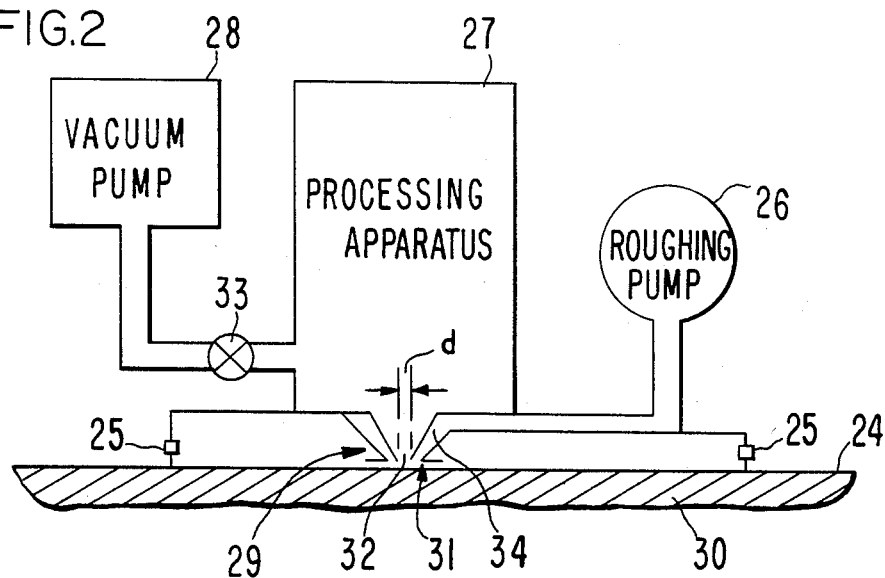
FIG. 2 is a pictorial side view of localized vacuum processing equipment which incorporates the envelope apparatus of the present invention.

The envelope apparatus of the present invention does not make physical contact with the wafer. A pictorial illustration of a system incorporating the envelope apparatus is shown in FIG. 2. Envelope apparatus 29 is attached to the bottom of processing apparatus 27. Envelope apparatus 29 is shown to be conically shaped with truncated end 31 being positioned in opposition to surface 24 of article 30 which is to undergo processing by apparatus 27. For processing flexible articles the envelope apparatus will necessarily be small so as to not produce bowing of the article due to the differential pressure between ambient and the various vacuum regions described below. The high vacuum to support the process is generated by high vacuum pump 28 and is communicated through high vacuum valve 33 to the chamber of processing apparatus 27. The working process is applied to surfaces 24 through the opening of width d. A graded vacuum seal is formed between truncated end 31 and the surface 24 of the article being processed with high vacuum being present at opening 32 and ambient existing outside cone 29. Inbetween, an intermediate vacuum is present as communicated from roughing pump 26 through annular conical sleeve 34. Additional intermediate vacuum stages may be utilized depending upon the vacuum requirements of the process. A gap is continuously maintained between the end 31 of the envelope apparatus 29 and the surface 24 of the article 30. This gap is either fixed or is dynamically maintained by means 25 within an acceptable range, e.g., 20 micrometers to 40 micrometers. The upper end of the range is limited by the gas inflow that can be tolerated while yet maintaining an acceptable vacuum in the internal processing zone. The lower end of the range is determined by the margin required to ensure that no contact is made with the wafer; for the reasons given above contact with the wafer must be avoided at all times.

Gap maintenance techniques include the use of a planar air bearing, the establishment of fixed positions for the article and the envelope apparatus, and the use of air micrometers of the type set out in M. Knobel, "Work Dimension and Position Detecting, Indicating and Controlling Method and Apparatus," U.S. Pat. No. 3,194,055. Other gap maintenance systems for use with an envelope apparatus of the type of the present invention are described in copending application "Gap Control System for Localized Vacuum Processing," U.S. Pat. No. 4,528,451 and assigned to the assignee of this application. Briefly, such a gap maintenance system comprises sensing means operative to provide a gap sense signal corresponding to the gap measured between the tip of the vacuum envelope and the article being processed. A control means is operative in response to changes in the gap to provide a control signal corresponding to the difference between the measured gap and a desired gap dimension or range of allowed dimensions. An actuating means is operative to vary the gap between the vacuum envelope and the article in response to the control signal. In a preferred embodiment, the actuating means includes three spaced apart, independently controlled actuators coupled through a workpiece holder to the workpiece, and the control means provides independent actuator signals to each of the actuators. The actuating means is thereby operative to vary the angle between the surface of the article being treated and the vacuum envelope when the independent actuators are actuated by unequal amounts.

Figure 3:
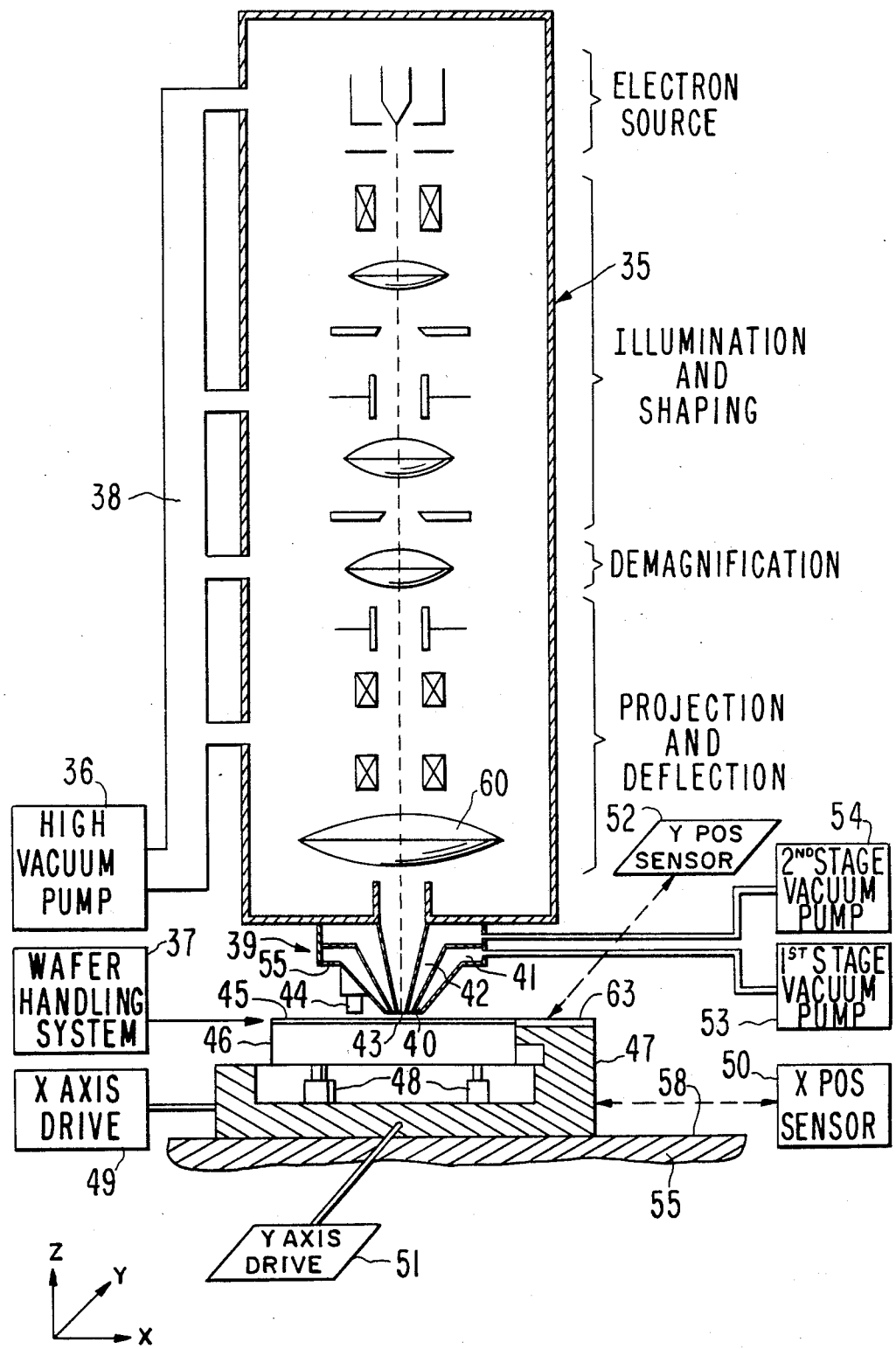
FIG. 3 is a side cross sectional view of an electron beam lithography system which incorporates the envelope apparatus of the present invention.
Figure 8:
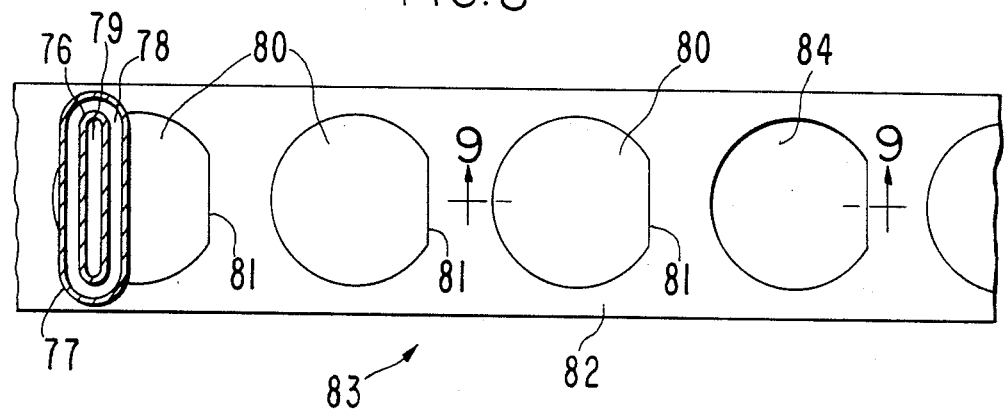
FIG. 8 is a plan view of a conveyor mechanism holding semiconductor wafers which are to be processed by equipment incorporating the envelope apparatus of the present invention.
Figure 9:
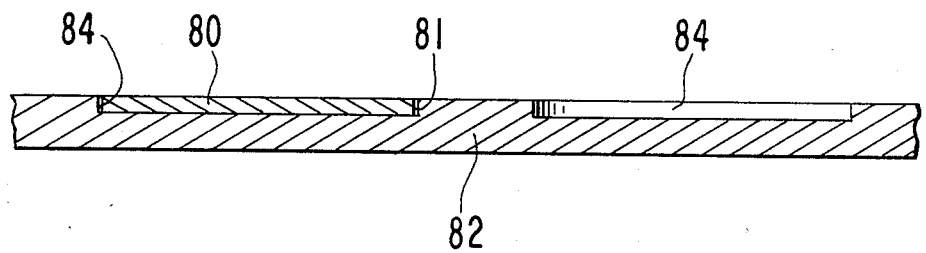
FIG. 9 is an expanded cross sectional view of the conveyor mechanism of FIG. 8.

When vacuum is lost or appreciably reduced, the vacuum envelope may have to lock-in to the newly-supplied substrate. Lock-in of the vacuum envelope may occur in several ways. In one embodiment a two-step vacuum lock-in process is employed. Here, before the high quality vacuum of the internal processing zone is established a sensor such as a capacitive sensor is employed to detect the relative proximity of the vacuum envelope to the surface of the article. The vacuum envelope is moved towards the article from above and/or from a laterally displaced position. The capacitive sensor provides information to the positioning means so that the vacuum envelope and the article come together close enough to establish the low level threshold vacuum. Once the low level threshold vacuum level is exceeded the high vacuum source for the internal processing zone is turned on. Then, the gap maintenance system described above is activated and equilibrium vacuum levels for the graded vacuum seal are quickly achieved. For semiconductor wafers of known and uniform thickness, as shown in FIG. 3, the wafers may be placed on a vacuum chuck 46 adjacent an alignment pad 63. The chuck lies below the pad a distance equal to the thickness of the wafer. Thus the stage 47 may be moved laterally with respect to vacuum envelope 39 and vacuum may be retained either over the pad 63 or over the wafer 45. Or, for ion implantation or metallization a link conveyor 83 having wells 84 as shown in FIGS. 8 and 9 may be used.

The present invention provides a contactless seal between the vacuum envelope and the surface of an article. Once the seal is formed, a vacuum may be generated and maintained within the interior zone of the envelope. This zone corresponds to a local regional area on the surface of the article being processed. Within the zone the particular vacuum process, e.g., electron beam welding, ion beam milling, a lithographic process, etc., is carried out. Typically, the vacuum envelope and the substrate are moved relative to each other so that the zone rests above different local regions at different times. The relative movement follows a pattern such that all relevant areas of the article are treated by the vacuum process before the article is removed and a new article is inserted for processing.

The contactless requirement of the present invention is readily met when articles which have generally planar surfaces or surfaces which have smoothly varying contours are treated. As a result of the smoothly varying contours few sudden Z-axis movements which might bring the tip of the envelope close to the wafer will be required. The acceptable values for the range of the gap between the tip of the vacuum apparatus and the article also depends upon the quality of the vacuum which is required for processing. If a low quality vacuum can be tolerated, e.g., greater than about $10^{-4}$ Torr as in a welding system, then a larger gap or a workpiece with an irregular surface may be tolerated. If a high quality vacuum is required, e.g., lower than about $10^{-4}$ Torr, as in semiconductor processing, then it is necessary that the gap be closely maintained and that the wafer be flat to within close tolerances. In the semiconductor industry wafers are routinely supplied by vendors with such a high degree of surface flatness. SEMI Standard M1.1 for Polished Monocrystalline Slices dated January 1981 specifies maximum allowable variations in wafer thickness and indicates that future revisions will specify flatness quality as well. In processing in the semiconductor industry, great care is taken to prevent warping of the wafers during processing so that the wafers are amenable to being handled in automated wafer handling equipment. See D. C. Guidici, "Wafer Flatness: An Overview of Measurement Considerations and Equipment Correlation", SPIE, v. 174, *Developments in Semiconductor Microlithography* IV, p. 132 (1979). High temperature processing, one of the primary sources of warpage, is almost eliminated by employing the apparatus of the present invention. Such warping is one of the most serious problems with semiconductor device processing. See D. Thebault, et al., "Review of Factors Affecting Warpage of Silicon Wafers", RCA Review, v. 41, p. 592, December 1980. The elimination of this warpage with the envelope apparatus of the present invention results from exposure of most of the wafer at any point in time to the ambient environment, thereby producing high overall heat transfer between the ambient and the wafer. Heat losses are especially great over that portion of the wafer in the vicinity of the localized region being treated since here the temperature differentials and thus the heat transfer rate is highest. Thus, any wafer warpage is made much less likely so that the gap is more readily maintained within the acceptable range.

As seen in the pictorial representation of FIG. 2, processing apparatus 27 employs the vacuum envelope apparatus 29 of the present invention. The article 30 which is undergoing processing of its surface 24 is presented in spaced apart, close coupled opposition to the tip 31 of envelope apparatus 29. Vacuum sufficient to support the process is supplied by vacuum pump 28 through valve 33 to apparatus 27 and thus to the interior processing zone 32 of envelope apparatus 27. When envelope apparatus 29 is moved with respect to article 30, typically by movement of article 30 but in some cases by movement of processing apparatus 27, portions of the surface area to be treated are successively exposed to the internal processing zone 32 having an orifice of dimension "d" within vacuum envelope apparatus 29. It is evident that the whole surface 24 of article 30 is never subjected in its entirety to the vacuum and that only a small localized region is subjected to vacuum and the associated processing at any one time. An intermediate vacuum level is produced by roughing pump 26 and communicated to tip 31 through channel 34 which surrounds internal processing zone 32. A graded vacuum seal is thus produced between the tip 31 of envelope apparatus 29 and the surface 24 of article 30. The graded vacuum seal extends from internal processing zone 32, under the opening of channel 34 and out to ambient. The gap between tip 31 and the surface 24 of article 30 may be fixed, if processing vacuum requirements are not severe, or may be dynamically controlled by means 25 as described in detail in U.S. Pat. No. 4,528,451. The location of the region undergoing processing will change as vacuum envelope apparatus 29 is moved with respect to article 30 by mechanical means (not shown). For beam applications the beam may be steered or scanned to fully or selectively cover that portion of the surface 24 of article 30 which is instantaneously exposed underneath the aperture of vacuum envelope means 29. This combined movement may be of the type disclosed in R. J. Collier, "Electron Beam Exposure System," U.S. Pat. No. 3,900,737.

A particular application of the envelope apparatus of the present invention is shown in FIG. 3, in the context of an electron beam lithography machine. An envelope apparatus 39 is attached to the bottom of electron beam column 35. The tip 40 of envelope 39 rests slightly above the surface of semiconductor wafer 45 mounted on vacuum chuck 46. A gap is maintained between the tip 40 of cone 39 and the surface of wafer 45. Within this gap a graded vacuum seal is formed when the machine is in operation. Since vacuum envelope 39 has a truncated conical shape, a radial seal is formed. Since the vacuum envelope 39 has interiorly positioned, spaced apart conical members, a series of discrete zones 43, 42 and 41 are formed, each zone being in communication with a vacuum pump. Intermediate zones 41 and 42 are in communication, respectively, with first stage pump 53 and with second stage pump 54. Zone 43 is in communication with high vacuum pump 36 which produces a vacuum sufficient to support the lithographic process. The quality of the vacuum at the tip necessarily reflects the low conductance between pump 36 and tip 40. The vacuum is graded from the level of the ambient environment to a low vacuum level produced by the first stage vacuum pump 53, to a higher vacuum level formed by second stage vacuum pump 54, to the high vacuum level formed by high vacuum pump 36 as communicated to tip 40. Due to low conductance produced by the filling of column 35 with electron optical elements such as lens 60 only a portion of the high vacuum is communicated to tip 40 of vacuum envelope 39. Sufficient high vacuum is, however, delivered through internal zone 43, and sufficient intermediate vacuum is delivered through zones 41 and 42 so that a graded vacuum seal is maintained as relative movement of stage assembly 47 is accomplished with respect to column 35. As a consequence, the point of processing of the working beam on the semiconductor wafer is always maintained under high vacuum even though that point moves over the surface of the semiconductor wafer.

Movement of the stage may be accomplished by any means which is capable of providing prompt, accurate movement in response to control signals such as feedback from an x-y laser interferometer. Short settling time is also a requirement. For example, orthogonal cylindrical air bearings may be employed. See D. R. Herriott, et al., "EBES: A Practical Electron Lithography System," IEEE Transactions on Electron Devices, ED-22, p. 385 (1975). Planar air bearings have also been proposed. See, W. L. Fox, "Vacuum-Sealed Gas-Bearing Assembly", U.S. Pat. No. 4,191,385; or a double sided planar air bearing may be utilized. B. G. Lewis, et al., "A Laser Interferometer Controlled X, Y Air Bearing for Direct Wafer Exposure Electron Beam Lithography," Proceedings, 10th International Conference on Electron and Ion Beam Science and Technology, p. 477 (1982). Such air bearing translation means have, however, been bulky, costly and often difficult to maintain in good running order. Preferably, linear motors may be used in a closed loop system as disclosed in copending application, Ser. No. 435,178 "Charged Particle Beam Lithography Incorporating Localized Vacuum Envelope," filed on even date herewith and assigned to the assignee of this application. Briefly, linear and smooth operating characteristics for the stage as well as simplicity of design are achieved by using linear motors, for example, linear motors of the Sawyer-principle type. With Sawyer-principle type motors, a moveable stage possesses a network of magnet poles which are wirewound and function as electromagnets. A baseplate has a matching or complementary network of poles. By appropriate switching of the polarity of the magnets on the moving stage, the poles are intermittently and selectively attracted by counterpart poles on the baseplate. The timing of the switching determines the speed of the motor. Extremely smooth movement is experienced. See, e.g., B. A. Sawyer, "Magnetic Positioning Device", No. Re 27, 289; J. Dunfield, et.al., "Sawyer-Principle Linear Motor Positions Without Feedback", *Power Transmission Design*, p. 72, June 1974.

Figure 4:
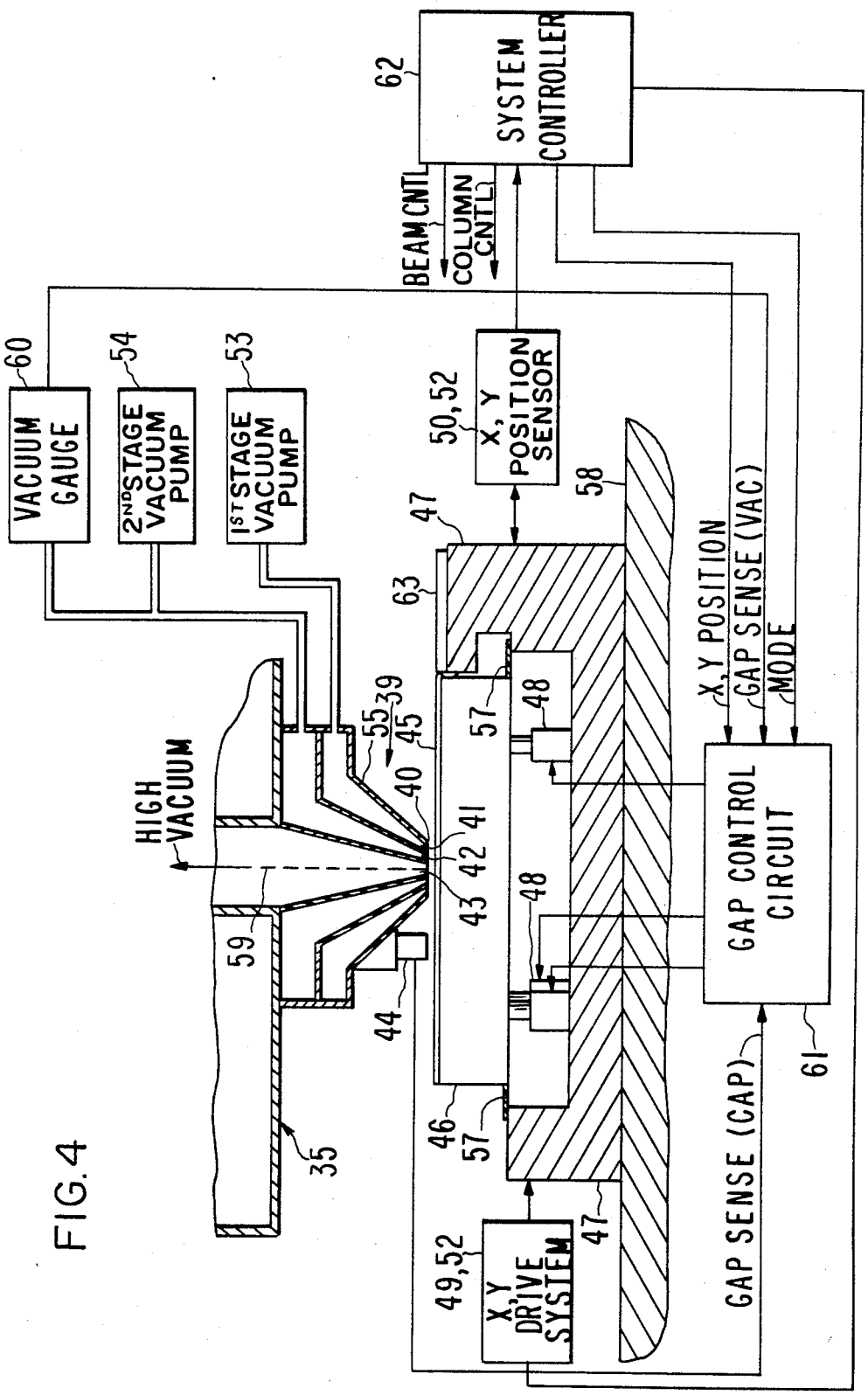
FIG. 4 is a detailed cross sectional side view of the envelope apparatus for vacuum processing of the present invention.

A serial loading capability is desirable in automated wafer processing equipment. Such a capability allows wafers to be moved from processing station to processing station and introduced to the next successive process without queing to form a batch. See F. T. Turner, et.al., "Individual Wafer Metallizing System-A Case History"; Industrial Research and Development, March 1981, p. 150 and April 1981, p. 148. With such an approach large batches of wafer are never placed at risk in a given process at any time. Such a serial loading capability is inherent with the vacuum envelope apparatus of the present invention since only a single wafer at a time is transported to the vacuum envelope apparatus and subjected to processing. This can be seen by reference to FIGS. 3 and 4 in which the lithography system is shown as having an alignment pad 63 positioned adjacent to wafer 45 on vacuum chuck 46. When a wafer 45 is being unloaded from or loaded onto vacuum chuck 46 on stage 47, stage 46 may be moved so that alignment pad 63 is placed in opposition to vacuum envelope 39, thereby allowing unloading and loading of wafers to occur unobstructed. When the tip of the vacuum envelope is positioned over the newly loaded wafer it is not necessary to reestablish processing vacuum as it has been retained.

Figure 5:
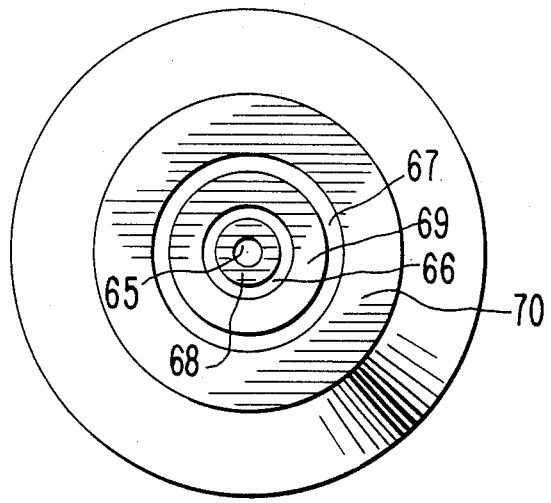
FIG. 5 is a bottom view of the tip of the vacuum envelope of the present invention.
Figure 6:
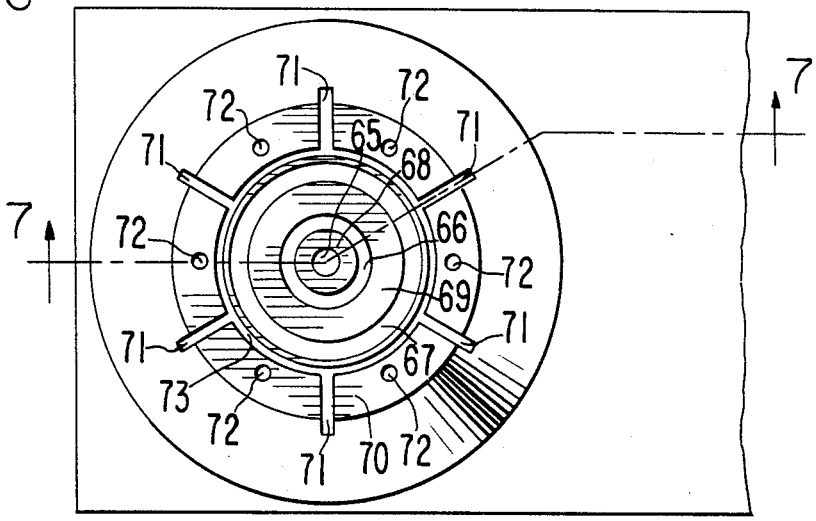
FIG. 6 is a bottom view of an alternate embodiment of the tip of the vacuum envelope of the present invention.
Figure 7:
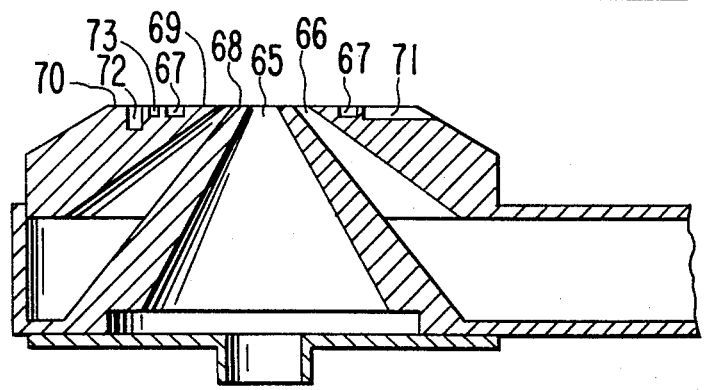
FIG. 7 is a cross sectional view of the vacuum envelope apparatus of FIG. 6 taken through line 7—7 of FIG. 6.

The tip of the vacuum envelope is shown in bottom view in FIGS. 5 and 6 and in cross section in FIG. 7. The tip in FIG. 5 corresponds to the three-stage vacuum envelope shown in side view schematic view in FIGS. 3 and 4; the tip in FIGS. 6 and 7 corresponds to the three-stage envelope plus air bearing embodiment shown in FIG. 10. For the three-stage vacuum envelope, high vacuum zone 65 is surrounded by conical member 68 and is connected to high vacuum pump 36; intermediate vacuum zone 66 is surrounded by annular conical member 69; and is connected to second stage vacuum pump 54; and intermediate vacuum zone 67 is surrounded by external conical member 70 and is connected to first stage vacuum pump 53. For the three-stage envelope plus air bearing, the same structure exists with the addition of air supply holes 72, annular groove 73 and radial air grooves 71. Air supply holes 72 are connected via zone 106 to a positive air supply 113. In operation, air is supplied at an appropriate pressure to produce an air bearing between surface 70 of the tip of the vacuum envelope and the surface of semiconductor wafer 99. In order to minimize the flow of air into vacuum groove 67, annular groove 73 is disposed to receive inwardly flowing air and conduct it through radial air grooves 71 outwardly to ambient. Relatively little air enters vacuum zone 67. Some air reaches ambient across the circumference of region 70, but most air flows through annular groove 73 and radial air grooves 71 to ambient.

The air flow from the positive air supply 113 prevents air from the surrounding room environment from entering the vacuum zone 67.

As shown in FIG. 7, the conical member 68 has a truncated conical shape tapering inwardly toward the high vacuum zone 65 and is concentric with the beam axis. Thus, the passage leading to high vacuum zone 65 increases in cross-sectional area as the distance from the tip increases. Likewise, the annular member 69 has an inner wall with a truncated conical shape tapering inwardly toward the intermediate vacuum zone 66. Thus, the passage formed between members 68 and 69 leading to intermediate vacuum zone 66 increases in cross-sectional area as the distance from the tip increases. In the embodiment of FIG. 7, the inner wall of member 69 has a taper greater than the taper of member 68.

Figure 10:
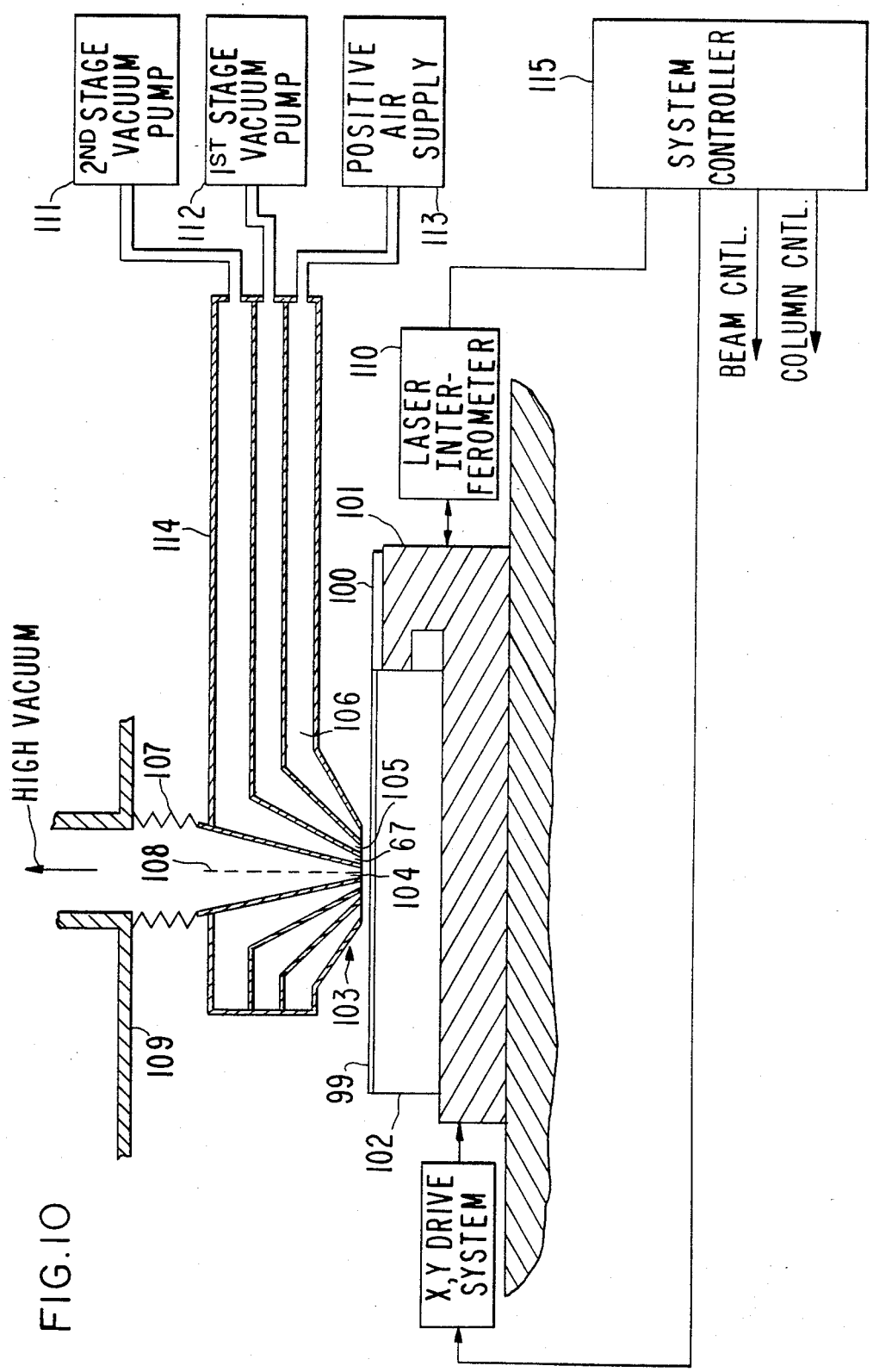
FIG. 10 is a detailed side view of the apparatus of FIGS. 6 and 7.

For the air bearing embodiment of FIGS. 6, 7 and 10, it is not necessary to provide active z-axis tracking between stage 101, vacuum chuck 102 and vacuum envelope apparatus 103. Instead, envelope apparatus 103 is attached by bellows 107 to processing chamber 109, e.g., to the electron optical column which produces working beam 108. As stage 101 is moved by X,Y drive system 116 with respect to the tip 105 of envelope apparatus 103, relative z-axis movement is provided by a dynamic equilibrium between the spring forces of bellows 107 and the forces exerted by the air bearing.

For purposes of illustration throughout this specification the vacuum envelope apparatus has been shown with vertical orientation with the processing apparatus being positioned above the article being treated. In practice, any orientation may be selected. For the processing of semiconductor wafers, for example, a horizontal orientation of the vacuum envelope may be preferred so that the wafer is oriented vertically thereby avoiding the settling of particulates onto the surface of the wafer. And for vacuum processing on the surface of irregularly shaped articles the orientation of the vacuum envelope will necessarily change as the mobile apparatus traverses the surface of the article. Or, the orientation of the apparatus may be chosen to match the configuration and nature of the processing system and the article may be presented in an orientation appropriate for the formation of a graded seal with the the apparatus.

Also, for purposes of illustration the vacuum envelope apparatus has been shown to be conically shaped. This permits a focused beam process to be supported over a small local region. Generally, however, the shape of the tip is selected to accommodate the particular process. For example, a rectangular shape would support a line scan. And for electron beam welding the shape of the vacuum envelope may be tailored to accommodate the topography of the surface of the article being welded. In each case the vacuum seal is maintained between the tip of the envelope apparatus and the surface of the article and spans the distance from the internal processing zone to ambient. The size of the envelope should not be so large that the article being processed will experience appreciable bending due to the differential pressures between the various vacuum levels present on one surface of the article and the ambient present on the other surface. Generally, the more rigid the article or the lower the vacuum levels, the larger the area of the internal processing zone that may be exposed to vacuum. The number of vacuum stages surrounding the internal high vacuum region and separating it from ambient may be one where low vacuum requirements are present, or may be two or more where higher vacuum levels are required. The vacuum envelope, as shown in FIGS. 6, 7 and 10, may also ride on a planar air bearing in order to maintain the gap within an acceptable range. The applications for which the envelope apparatus of the present invention may be utilized are of two principal types: large surface area treatment and lithographic. For the latter application the internal high vacuum zone is small since the working beam is scanned only over distances of the order of a few millimeters with substrate translation accomplishing relative movement of larger size. Due to the depth of focus specifications, e.g., of an electron beam, it is often necessary to obtain accurate z-axis control as described in detail in Applicant's copending applications, Ser. Nos. 435,177 and 435,178, filed on even date herewith. In order to utilize as much of the mask or silicon real estate as possible the envelope apparatus must function as close to the edges as possible, thereby creating a preference for small sized apparatus. For focused beam processing a conical shape is preferred since the shape provides good vacuum conductance to the tip and since the small tip is associated with small differential forces being applied to the article being processed. For gross applications, larger envelope structures of varied shapes may be employed since there typically will be less concern about the edges. As shown in FIGS. 8 and 9 moving conveyor 83 has a surface 82 having wells 84. The wells 84 are configured to receive semiconductor wafers 80 having flats 81. Preferably, the exposed surfaces of the semiconductor wafers are coplanar with the surface 82 of conveyor 83. Also, preferably, wafers are held in wells 84 by conventional vacuum chuck means (not shown). The conveyor may be moved underneath vacuum envelope 77 (shown in partial cross sectional view) positioned at the end, for example, of an ion implanter, plasma etching or sputter deposition machine. Processing is supported in internal vacuum zone 79 while an intermediate vacuum is established in zone 78. A graded vacuum seal is established from internal vacuum zone 79, underneath wall 76, across intermediate vacuum zone 78, underneath wall 77 and out to ambient. The overlap of internal vacuum zone 79 may cause processing to occur on the surface 82 adjacent wells 84; the impact of this processing may be minimized by using specific scan patterns in the case of ion implantation or by refinishing or replacing conveyor 83 periodically. Such a continuous approach to processing would be suitable for ribbon semiconductor materials fabricated for solar cell applications. For example, ion implantation of a silicon ribbon grown by edge defined film fed growth could be accomplished by running the ribbon under an envelope apparatus attached to an ion implanter.

What is claimed is:

1. Charged particle beam apparatus wherein a thin, flexible workpiece surface is treated by the beam comprising a high vacuum envelope in a first vacuum and having a tip containing an aperture, a charged particle beam source located in the vacuum envelope for deriving a charged particle beam that is directed through the aperture as a treating beam for the workpiece surface, means for maintaining only a portion of the workpiece surface in approximate registration with the aperture in a vacuum such that the beam can propagate from the source to the workpiece surface portion exclusively in a second vacuum having a value that is only somewhat lower than the high vacuum, said maintaining means including: (a) means for holding the workpiece so that all of the workpiece, except said workpiece surface portion, is in an ambient environment not subjected to the vacuum; (b) means for forming a gap between the tip and the workpiece without contacting the workpiece so that the tip is positioned opposite from the workpiece surface, the gap being dimensioned to minimize the flow of gas through it and to enable the workpiece to be moved so that the workpiece surface can move generally transversely of the beam propagation direction without contacting any of the tip to enable different portions of the workpiece surface to be treated in a vacuo by the beam at differing times, and (c) means forming a vacuum seal in the gap for minimizing degradation of the vacuum through the gap; said means for forming the vacuum seal including: vacuum pump means connected to a first fluid passage surrounding the aperture for providing a third vacuum between the tip and the workpiece surface in the gap, the first fluid passage causing the third vacuum to surround the second vacuum, the third vacuum being a lower vacuum than the second vacuum, whereby a radial graded vacuum seal is formed in the gap, and a second fluid passage for providing a flow of gas outside of the first fluid passage so that the flow of ambient air into the first, second and third vacuums is prevented, the aperture area of the tip and the treated area in the second vacuum being sufficiently small relative to the workpiece surface area to minimize bowing of the thin, flexible workpiece and to permit treatment close to the workpiece edge without loss of vacuum in the gap, the first fluid passage increasing in cross-sectional area with distance from from the gap so as to provide high vacuum conductance to the tip.

2. The apparatus of claim 1 further including a third fluid passage connected to vacuum pump means for providing a fourth vacuum between the tip and the workpiece surface in the gap, the third fluid passage causing the fourth vacuum to surround the third vacuum, the second and third fluid passages being arranged so that the gas flow provided by the second passage is outside of the third passage for substantially preventing the flow of ambient air into the fourth vacuum.

3. Output device for use with a vacuum processing system for treating the surface of a thin, flexible workpiece and for use with a first vacuum source and a second vacuum source providing a lower vacuum than said first source, said device comprising:

first vacuum envelope means adapted for connection to said first vacuum source;

second vacuum envelope means adapted for connection to said second vacuum source;

said first and second envelope means having respective first and second apertures;

said second aperture surrounding said first aperture in evenly spaced relationship thereto;

said first and second apertures lying in a plane and having sufficiently small areas relative to the workpiece area to permit treatment of the workpiece surface close to its edge without breaking vacuum in the apertures and to minimize bowing of the thin, flexible workpiece caused by differential pressure thereacross;

means for maintaining said apertures within a predetermined range of close spacing to said surface without any contact between the device and the surface;

said first aperture and at least a portion of said first envelope means transmitting the output of said vacuum processing system to said surface;

said first and second vacuum envelopes being of a truncated conical form extending from said apertures; and means for causing relative lateral motion between said surface and said apertures.

4. A device as in claim 3 which further includes a third envelope means positioned about said second envelope means and adapted for connection to a third vacuum source, said second source providing a stronger vacuum than said third source, said third envelope defining a third aperture surrounding said second aperture in evenly spaced relationship thereto, and aligned in said plane.

5. A device as in claim 3 in which said means for maintaining said apertures within a predetermined spacing range from said surface includes an air bearing surrounding said envelope means and communicating with a source of positive air pressure, said air bearing directing air under said pressure substantially radially outwardly of said apertures.

6. A device as in claim 5 in which said air bearing defines an annular surface aligned with said plane and grooved radially and annularly, said positive air pressure directing air substantially outwardly and along said radial grooves.

7. A device as in claim 5 which further includes resilient bellow-like means connecting said processing system and said device, said resilient means and said air bearing being in dynamic balance with each other during operation.

8. A device as in claim 3 in which said means for providing relative movement moves said workpiece laterally beneath said apertures.

9. Charged particle beam apparatus wherein a semiconductor wafer workpiece surface is treated by the beam comprising a high vacuum envelope in a first vacuum and having a tip containing an aperture, a charged particle beam source located in the vacuum envelope for deriving a charged particle beam that is directed through the aperture as a treating beam for the workpiece surface, means for maintaining only a portion of the workpiece surface in approximate registration with the aperture in a vacuum such that the beam can propagate from the source to the workpiece surface portion exclusively in a first passage, the first passage terminating at the aperture and being in a second vacuum having a value that is only somewhat lower than the high vacuum, said maintaining means including: (a) means for holding the workpiece so that all of the workpiece, except said workpiece surface portion, is in an ambient environment not subjected to the vacuum; (b) means for forming a gap between the tip and the workpiece without contacting the workpiece so that the tip is positioned opposite from the workpiece surface, the gap being dimensioned to minimize the flow of gas through it and to enable the workpiece to be moved so that the workpiece surface can move generally transversely of the beam propagation direction without contacting any of the tip to enable different portions of the workpiece surface to be treated in vacuo by the beam at differing times, and (c) means forming a vacuum seal in the gap for minimizing degradation of the vacuum through the gap; said means for forming the vacuum seal including: vacuum pump means connected to a second passage surrounding the first passage for providing a third vacuum between the tip and the workpiece surface in the gap, the second fluid passage causing the third vacuum to surround the second vacuum, the third vacuum being a lower vacuum than the second vacuum, whereby a radial graded vacuum seal is formed in the gap, the tip terminating in a plane forming one side of the gap, the passages terminating at said plane, at least one of the passages having a cross sectional area that increases as the distance of said one passage increases from said plane, the area of the tip being sufficiently small relative to the workpiece surface area to permit treatment close to the workpiece edge without loss of the vacuum in the gap and to minimize bowing of the semiconductor wafer workpiece caused by differenial pressure thereacross.

10. The apparatus of claim 9 wherein the cross sectional areas of both the first and second passages increase as the distance of said passages increases from said plane.

11. The apparatus of claim 10 wherein the passages are configured to have at least one wall tapering inwardly toward the aperture and away from the remainder of the envelope toward the plane, the second passage having first and second walls respectively close to and remote from the beam axis, the second wall having a taper greater than any taper of the first wall.

12. The apparatus of claim 9 wherein the cross sectional area of the first passage increases as the distance of said passage increases from said plane.

13. The apparatus of claim 12 wherein the first passage is configured to have a wall concentric with the beam axis, said wall tapering inwardly toward the aperture and away from the remainder of the envelope toward the plane.

14. The apparatus of claim 9 wherein the tip terminates in a plane forming one side of the gap, the first and second fluid passages being formed in a truncated conical structure having a face defined by the plane, the conical structure extending inwardly toward the aperture and away from the remainder of the envelope toward the plane, the first and second passages being configured to have walls concentric with the beam axis, the walls being tapered inwardly toward the aperture and away from the remainder of the envelope toward the plane, the second passage having first and second walls respectively close to and remote from the beam axis, the second wall having a greater taper than the first wall so that the cross sectional areas of the first and second passages increase as the distance of the passages from said plane increases.

15. A method of treating the surface of a thin, flexible workpiece with a charged particle beam, comprising the steps of:
directing a beam from a source located in a vacuum envelope through an aperture in a vacuum tip of the envelope onto a first portion of the workpiece surface that is approximately in registration with the aperture;
maintaining a gap between the vacuum tip and the first portion of the workpiece surface sufficient to prevent contact therebetween;
maintaining the first portion of the workpiece surface in vacuum while maintaining the remainder of the workpiece surface in an ambient environment outside of the vacuum, the vacuum being formed by using vacuum pump means to form a graded vacuum seal in the gap while the first portion of the workpiece surface is being treated by the charged particle beam, the gap and seal being such that the beam is exclusively in vacuum while propagating from the envelope to the first portion of the surface;
limiting the aperture and the first portion of the workpiece surface to a sufficiently small area relative to the workpiece area to minimize bowing of the workpiece caused by differential pressure thereacross and to permit treatment close to the workpiece edge without loss of vacuum in the gap while providing high vacuum in the gap by connecting the graded seal in the gap to the vacuum pump means through high vacuum conductance passages which increase in cross-sectional area as the distance from the gap increases; and
moving the workpiece surface relative to the aperture so that different portions of the surface are successively in registration with the aperture while maintaining the gap between the workpiece surface and the aperture and without breaking the vacuum seal between the workpiece surface and the vacuum envelope interior so as to treat selected portions of the workpiece surface.

* * * * *